United States Patent

Kanazawa

[11] Patent Number: 6,038,382
[45] Date of Patent: Mar. 14, 2000

[54] METHOD AND APPARATUS FOR OPTIMIZING CELL ALLOCATION

[75] Inventor: Yuzi Kanazawa, Kawasaki, Japan

[73] Assignee: Fujitsu Limited, Kawasaki, Japan

[21] Appl. No.: 08/924,702

[22] Filed: Sep. 5, 1997

[30] Foreign Application Priority Data

Feb. 12, 1997 [JP] Japan ................................ 9-027152

[51] Int. Cl.[7] ................................................ G06F 15/00
[52] U.S. Cl. .......................... 395/500.04; 395/500.08; 395/500.11
[58] Field of Search .................... 364/488, 489, 364/490, 491; 395/500.04, 500.08, 500.11

[56] References Cited

U.S. PATENT DOCUMENTS

| | | | |
|---|---|---|---|
| 5,341,308 | 8/1994 | Mendel ................................ | 364/489 |
| 5,513,124 | 4/1996 | Trimberger et al. .................... | 364/491 |
| 5,798,936 | 8/1998 | Cheng .................................... | 364/489 |
| 5,838,585 | 11/1998 | Scepanovic et al. ................... | 364/491 |
| 5,930,499 | 6/1999 | Chen et al. ............................ | 395/500.09 |

OTHER PUBLICATIONS

Tan et al. "An Efficient Multi–Way Algorithm for Balanced Partitioning of VLSI Circuits," 1997 IEEE International Conference on Computer Design: VLSI in Computers and Processors, Oct. 12–15, 1997, p.608–613.

Mayrhofer and Lauther "Congestion–Driven Placement Using a New Multi–Partitioning Heuristic," 1990 International Conference on Computer–Aided Design, Nov. 11–15, 1990, p.332–335.

Yang and Wong "Efficient Flow Based Min–Cut Balanced Partitioning," IEEE/ACM International Conference on Computer–Aided Design, Nov. 6–10, 1994, p. 50–55.

Yang, Hannah Honghua and D.F. Wong "Efficient Network Flow Based Min–Cut Balanced Partitioning," IEEE, 1996.

Hoffmann, Achim G. "Towards Optimizing Global MinCut Partitioning," IEEE, 1991.

Bhandari, Inderpal and Mark Hirsch and Daniel Slewlorek "The Min–Cut Shuffle: Toward a Solution for the Global Effect Problem of Min–Cut Placement," 25th ACM/IEEE Design Automation Conference, 1988.

Kawaguchi, Kenichi and Chie Iwasaki and Michiaki Muraoka "A RTL Partitioning Method with a Fast Min–Cut Improvement Algorithm," Design Automation Conference '97.

N. Sherwani, "Algorithms for VLSI Physical Design Automation Second Edition", pp. 258–262 (1995).

*Primary Examiner*—Kevin J. Teska
*Assistant Examiner*—Marcel Pruessner
*Attorney, Agent, or Firm*—Staas & Halsey LLP

[57] ABSTRACT

When deciding on cell allocation, the existing cut position is searched for using an existing cut position deciding module. The balance of the existing cuts is incorporated into its restriction requirements using a restriction requirements judging module and the Min-cut method. When deciding on the cell allocation, a cost function calculating module uses such a cost function as to reduce the resulting cost when the existing cuts are balanced using the existing cut position, which has been obtained using the existing cut position deciding module. Then the Min-cut method based on this cost function is executed.

19 Claims, 16 Drawing Sheets

WHEN DIVIDED INTO TWO BLOCKS

WHEN DIVIDED INTO FOUR BLOCKS

PRIOR ART

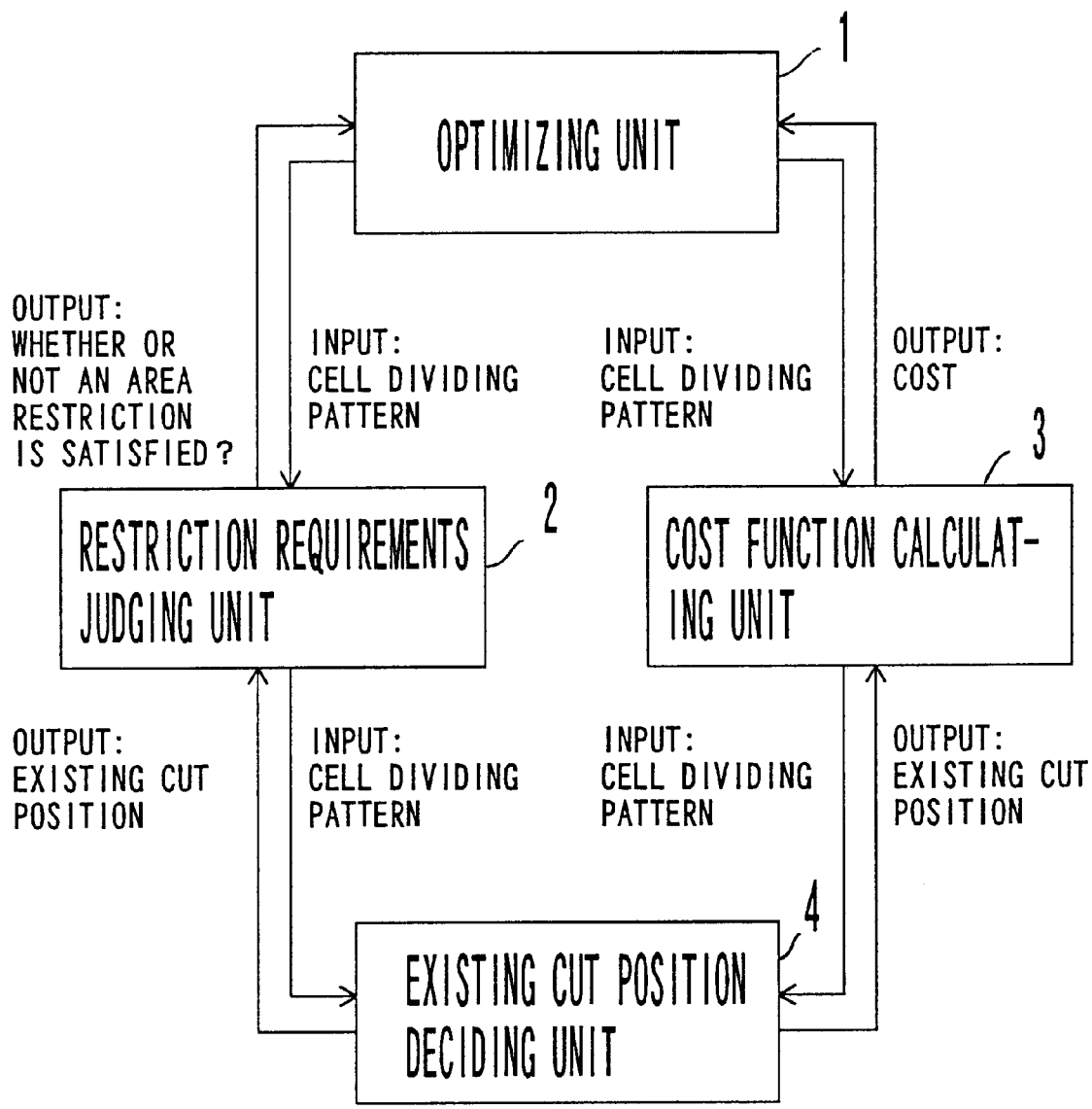
F I G. 5

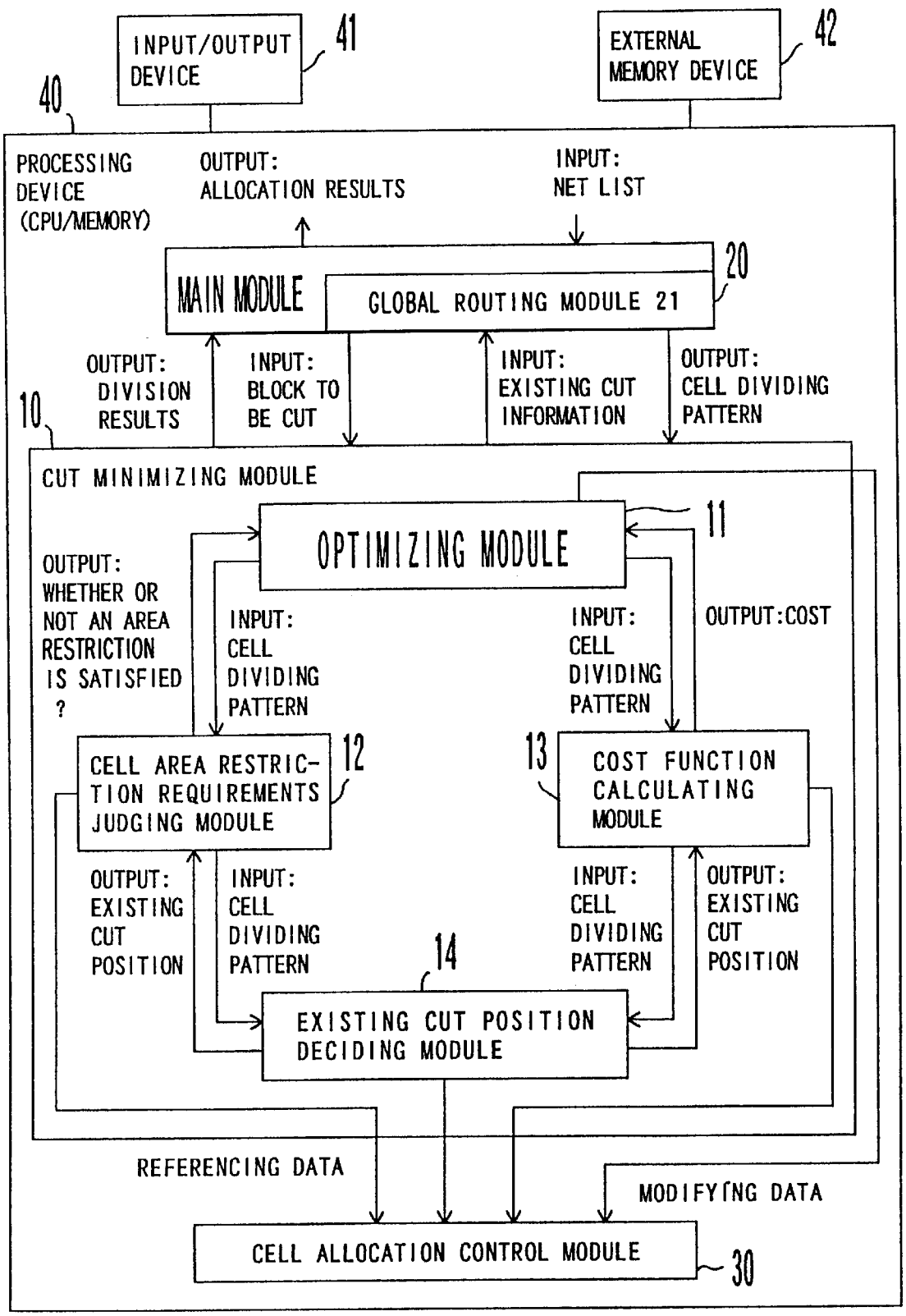
F I G. 6

| | |
|---|---|
| celllist | LIST OF CELL NUMBERS CONNECTED TO NET |
| cellnum0 | NUMBER OF CELLS IN BLOCK 0 |
| cellnum1 | NUMBER OF CELLS IN BLOCK 1 |
| cutright | SET TO TRUE AND FALSE WHEN THE EXISTING CUTS ARE ON THE RIGHT SIDE AND WHEN NOT ON THE LEFT RESPECTIVELY |
| cutleft | SET TO TRUE AND FALSE WHEN THE EXISTING CUTS ARE ON THE LEFT SIDE AND WHEN NOT ON THE RIGHT RESPECTIVELY |

FIG. 7A

| | |
|---|---|
| WHEN cellnum0=0 AND cellnum1>0 | NET EXISTS IN BLOCK 1 |
| WHEN cellnum0>0 AND cellnum1=0 | NET EXISTS IN BLOCK 0 |
| WHEN cellnum0>0 AND cellnum1>0 | NET IS CUT |

FIG. 7B

| | |
|---|---|
| netlist | LIST OF NET NUMBERS CONNECTED TO CELLS |
| block | BLOCK CONTAINING CELLS |

FIG. 7C

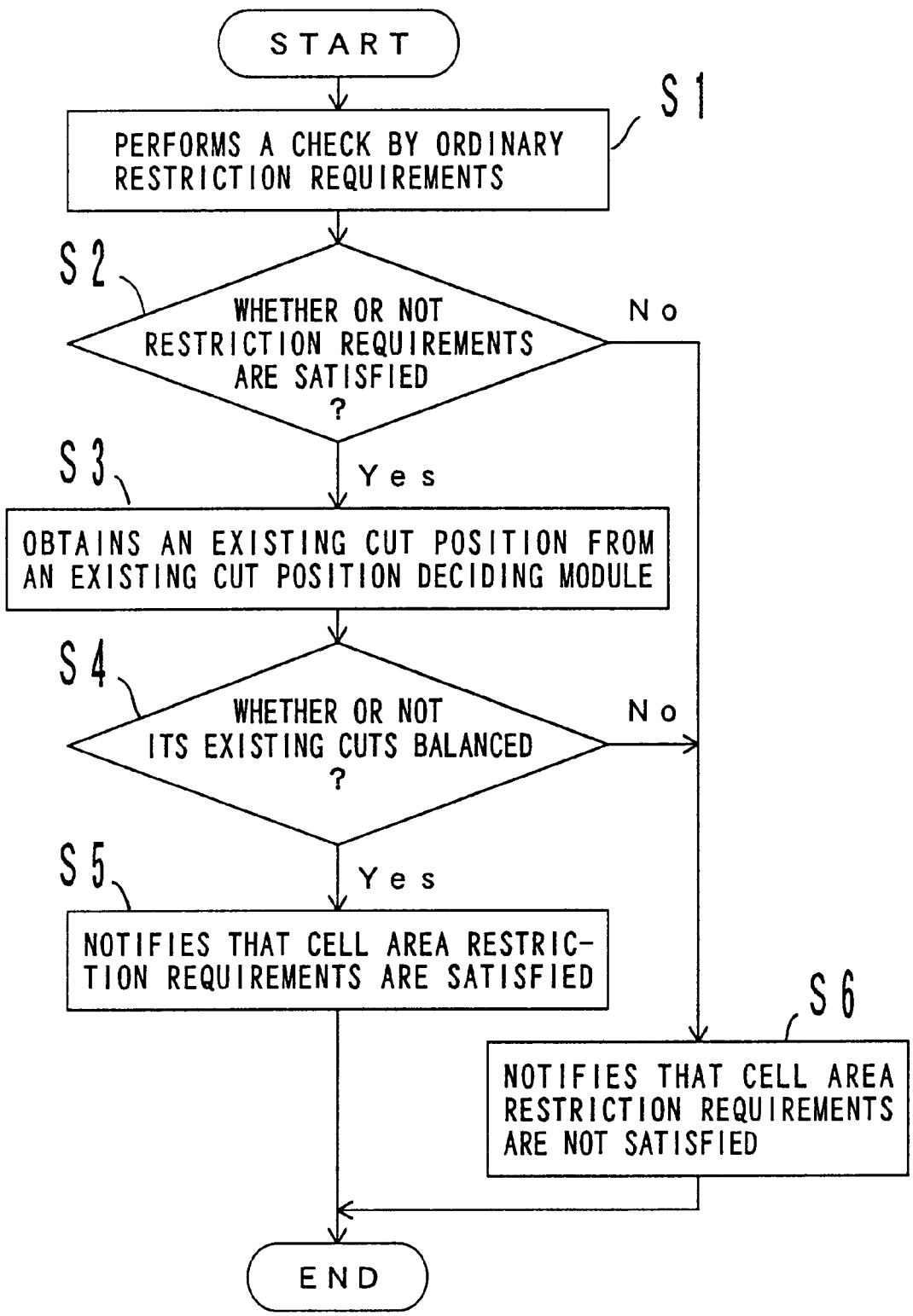
F I G. 8

50 (———):CUT LINE WHICH HAS ALREADY DIVIDED
51 (------------):CUT LINE WHICH IS GOING TO DIVIDE 50 ( ———— ):CUT LINE WHICH HAS ALREADY DIVIDED
51 ( ------------ ):CUT LINE WHICH IS GOING TO DIVIDE

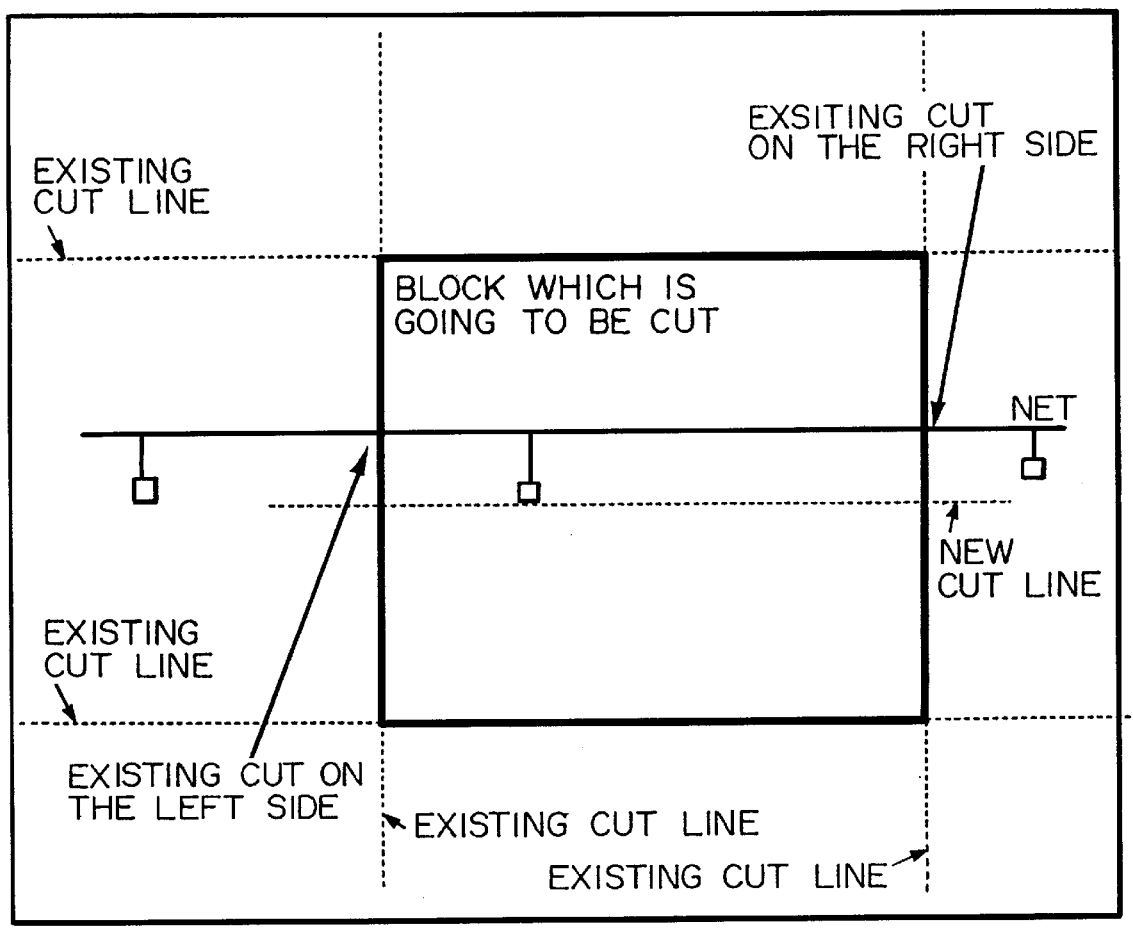
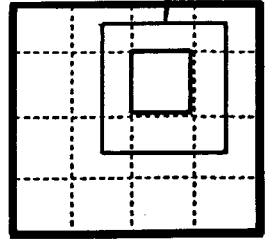
FIG. 12

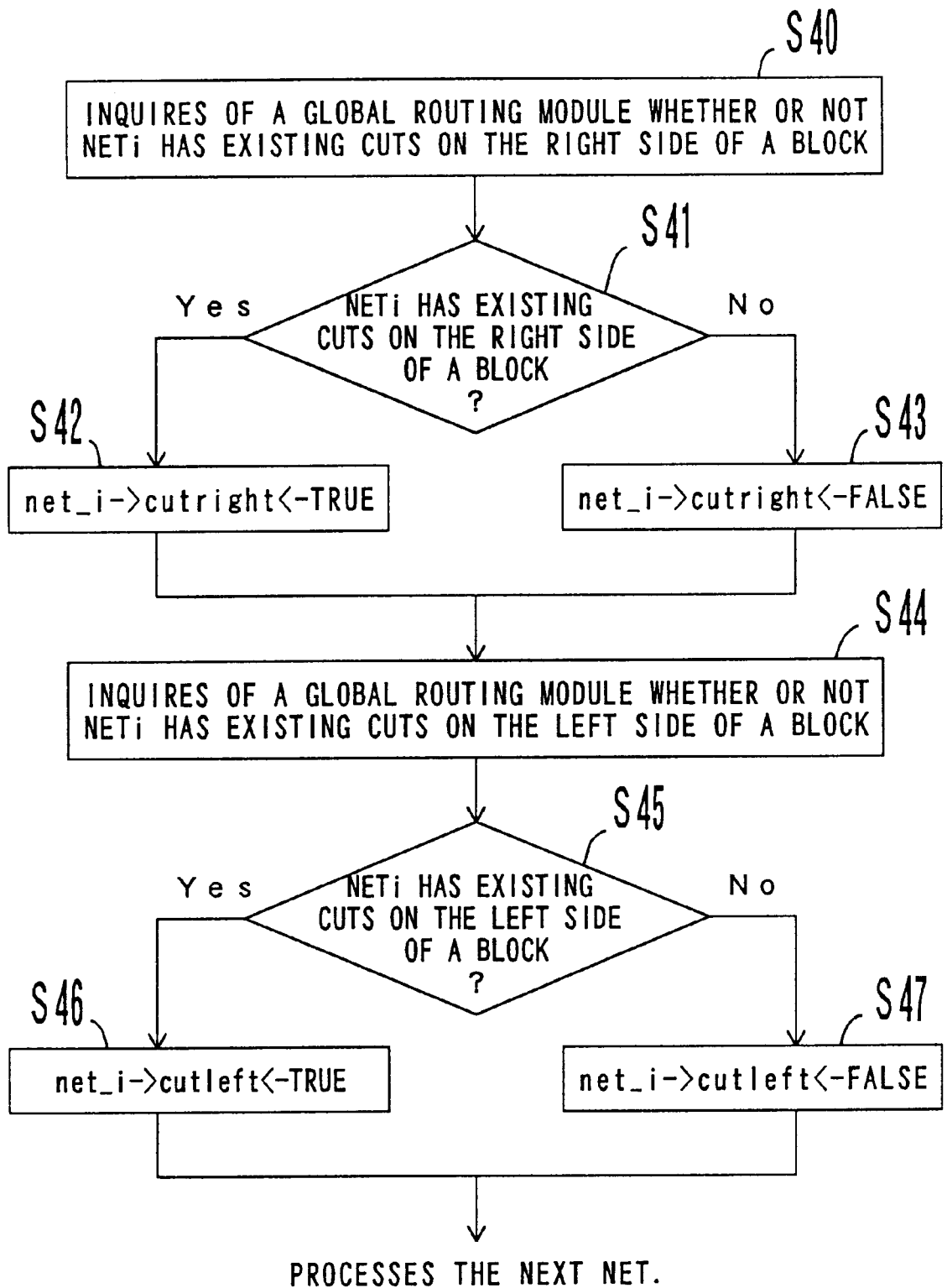
F I G. 1 3

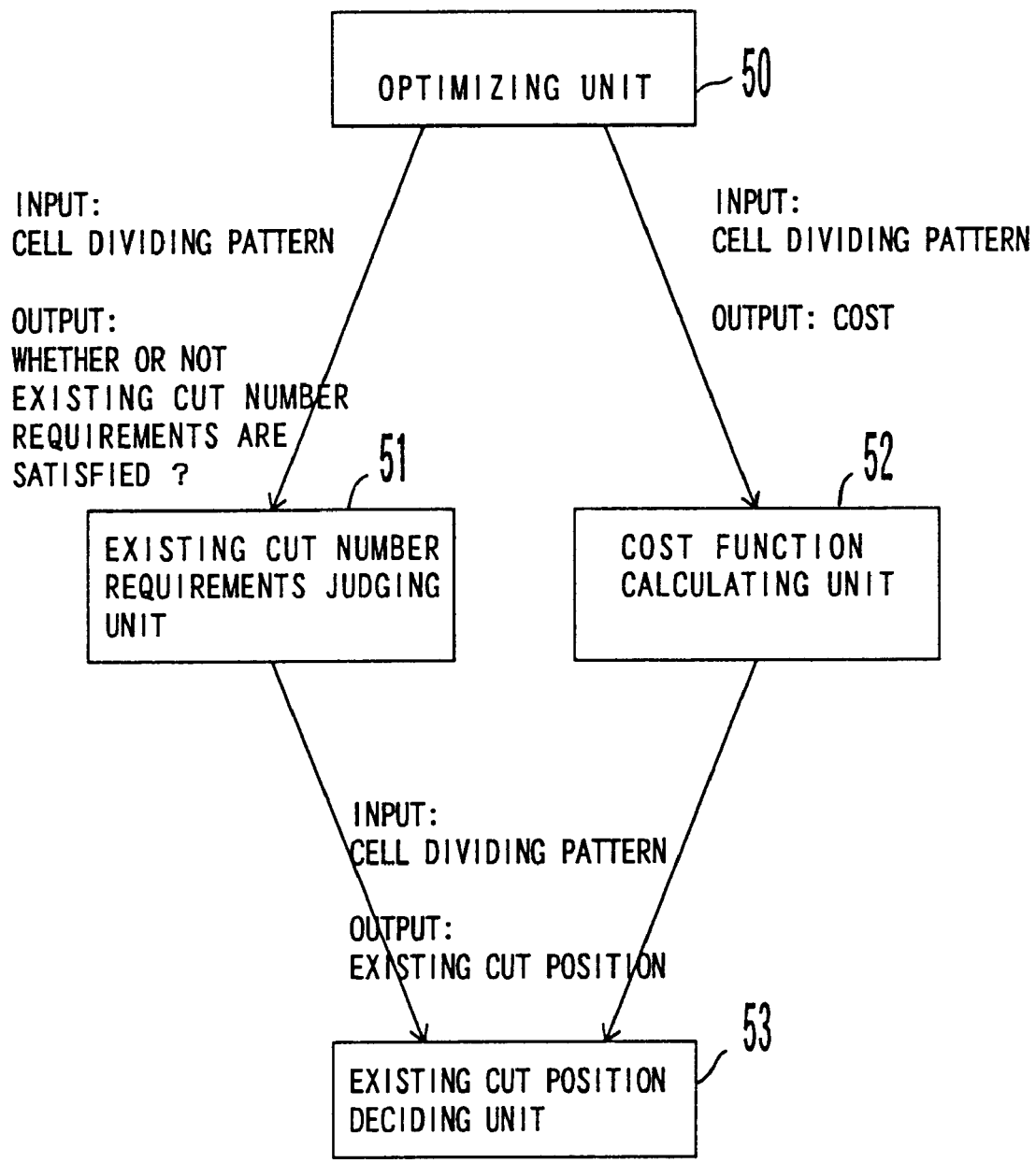
F I G. 16

METHOD AND APPARATUS FOR OPTIMIZING CELL ALLOCATION

BACKGROUND OF THE INVENTION

1. Field of the Invention

The present invention relates to a method for optimizing a cell allocation using the Min-cut method in the design system of LSI and its apparatus.

2. Description of the Related Art

For example, in LSI designing using a computer for a logic design, firstly, cells of logic elements such as AND and OR gates, and how to interconnect these cells (called a "net") are decided. Secondly, how to position cells on a chip is decided. Lastly, how to spread the net among the cells is decided.

The Min-cut method is often used in cell allocation. FIGS. 1A and 1B show the Min-cut method. In the figures, 100 indicates an LSI block in which cells are allocated, 110 to 114 cells, 120 a net not cut, 121 a cut, and 130 and 131 cut lines for dividing a block respectively.

In the conventional Min-cut method cell allocation block of LSI 100 is divided into several blocks, and Cells 110 to 114 are allocated to each block. In this case there is a division into two blocks horizontally or vertically as shown in FIG. 1A, one into four blocks horizontally and vertically at the same time as shown in FIG. 1B and one into more blocks for this dividing method.

At this time the following conditions shall be satisfied.

a) The total of cell areas to be allocated to each block shall satisfy certain restriction requirements. In the case of a division into two blocks, for example, the following equation shall be satisfied for a constant $\epsilon$ which is more than 0.

$$|S_1/A_1 - S_2/A_2| < \epsilon$$

where $S_1$: Total of cell areas allocated to Block 1
$A_1$: Area of Block 1
$S_2$: Total of cell areas allocated to Block 2
$A_2$: Area of Block 2 b) When a cell connected to a certain net is allocated to another block, a net crossing a line dividing a block (cut line) (the net is called a "cut") is generated. Cells shall be allocated to each block so that the number of its cuts may be reduced as much as possible. A method can also be used for minimizing a cost function which is generated by attaching weight $W_i$ to net i and taking the sum total of weight $W_i$ of nets crossing a cut line.

There are various methods for obtaining such a division so as to minimize the cost function including the Fidducia-Matteyses(FM) method. Here, we shall call these requirements for optimizing a cell allocation, as mentioned in a) and b), "optimizing requirements."

FIG. 2 shows the conventional method for obtaining such a division so as to minimize a cost function.

As shown in FIG. 2 a system for obtaining such a division so as to minimize a cost function is provided with cell area restriction requirements judging module 150 for judging whether or not its pattern satisfies its cell area restriction using a cell dividing pattern as an input, and cost function calculating module 160 for outputting a cost function for the pattern using a cell dividing pattern as an input, and it is structured so that a dividing pattern for giving the minimum cost function may be obtained under the restriction requirements while optimization module 140 is calling up both modules.

In its actual implementation it is designed so that its area restriction and cost function change can be output as a result of using a difference from the current dividing pattern (for example, information of "cell A moves from Block 1 to Block 2" as an input.

FIG. 3 shows a cell position deciding method by the conventional Min-cut method. After Block 100 is divided by cut line 130, each block is divided again in the same way. When the block size is reduced sufficiently by repeating divisions such as a division by cut line 131, a division by cut lines 132 and 133, and further, a division by cut lines 134 and 135, its cell position is decided by the module shown in FIG. 2.

Why the number of its cuts is minimized is because it is anticipated that the density of a net is reduced and its routing becomes easy.

However, because in the conventional Min-cut method how to arrange the cut made by the current division by means of a cut line was not taken into consideration, as a result there was a possibility that the number of its cuts might be unbalanced on the boundary of each block.

FIGS. 4A and 4B show when, in the conventional Min-cut method, the existing cuts become unbalanced by the current cut line.

Here, the state where a division is made again after the first division is assumed. As shown in FIG. 4A it is assumed that the number of its cuts is 100 when, first, a division is made vertically by vertical cut line 130. Next, as shown in FIG. 4B, a division is made horizontally by horizontal cut line 131. At this time when cells connected to all the first 100 pieces of cuts are allocated to its upper half, the density of the upper half becomes higher than its lower half and its routing becomes difficult to make.

As in the conventional Min-cut method, one part with a high net density and one with a low net density are generated and their routing density often becomes unbalanced. Therefore, a cell allocation most suitable for its routing could not necessarily be obtained.

SUMMARY OF THE INVENTION

It is an object of the present invention to provide a method for solving the problem mentioned above, averaging its routing density and deciding its cell allocation most efficiently for its routing.

The cell allocation optimizing method in the first aspect of this invention is one which uses a computer, which decides its cell allocation in the designated area by the Min-cut method, and is provided with a step for allocating its cells to each divided area of said area or moving its allocated cells among divided blocks, a step for judging whether or not restriction requirements on the total of cell areas allocated to said divided blocks as well as the balance of the existing cuts which are nets crossing cut lines for dividing said block and a step for re-allocating its cells to said divided blocks or moving its cells among said divided blocks when said restriction requirements are not satisfied.

The cell allocation optimizing method in the second aspect of this invention is one which uses a computer, which decides its cell allocation in the designated block by the Min-cut method, and is provided with a step for allocating its cells to each divided block of said block or moving its allocated cells among divided blocks, a step for calculating its cost using such a cost function as to reduce its resulting cost when the existing cuts which are nets crossing cut lines for dividing said block concerning the allocation of cells allocated to said divided blocks balances, and a step for searching such a cell allocation as to reduce said cost by re-allocating its cells to said divided blocks or moving its cells among said divided blocks.

The cell allocation optimizing method in the third aspect of this invention is one which uses the Min-cut method, and is provided with a step for setting cut lines for dividing the blocks to which cells, connected by plural nets, are allocated, a step for calculating the number of the existing cuts contained in the first and second blocks which are generated by dividing said block with said cut lines, a step for judging whether or not the number of the existing cuts in the first and second blocks satisfy its optimizing requirements, and a step for modifying said cell allocation so that the number of the existing cuts in said first and second blocks satisfy said optimizing requirements.

The cell allocation optimizing apparatus in the first aspect of this invention is one which decides the most suitable cell allocation in the designated block using the Min-cut method, and is provided with an existing cut position deciding unit for deciding the position of the existing cuts, a restriction requirements judging unit for judging the predetermined restriction requirements on whether or not the positions of the existing cuts decided by said existing cut position deciding unit are balanced, and an optimizing unit for generating other cell dividing patterns and controlling the repetition of the processes of said restriction requirements judging unit and said existing cut position deciding unit.

The cell allocation optimizing apparatus in the second aspect of this invention is one which decides the most suitable cell allocation in the designated block using the Min-cut method, and is provided with an existing cut position deciding unit for inputting its cell dividing pattern showing the state where its cells are allocated to each divided block of said block and deciding the position of the existing cuts, a cost function calculating unit for calculating its cost on the current cell dividing pattern using such a cost function as to reduce its resulting cost, and an optimizing unit for generating other cell dividing patterns and controlling the repetition of the processes of said cost function calculating unit and said existing cut position deciding unit.

The cell allocation optimizing apparatus in the third aspect of this invention is one which decides the most suitable cell allocation in the designated block using the Min-cut method, and is provided with a setting unit for setting cut lines for dividing its blocks to which cells connected by plural nets are allocated, an existing cut position deciding unit for calculating the number of the existing cuts contained in the first and second blocks which are generated by dividing said block with said cut lines, an optimizing requirements judging unit for judging whether or not the number of the existing cuts in the first and second blocks satisfy their optimizing requirements, and a cell allocation modifying unit for modifying said cell allocation so that the number of the existing cuts in the first and second blocks satisfy said optimizing requirements.

How to distribute the existing cuts after its block is divided has been added to the conventional cell allocation optimizing method in which only how to balance the total cell areas contained in its block and how to reduce the number of cuts are taken into consideration.

In this way the bias of the existing cut positions can be prevented by taking into consideration the balance of the number of the existing cuts belonging to each block generated after the division. Therefore, such a problem where although its cells allocated on a chip can be distributed evenly, routing crowds do not occur in the actual manufacturing process. Namely, it becomes possible to design so as to manufacture routing easily because not only cells but also its routing can be distributed evenly.

BRIEF DESCRIPTION OF THE DRAWINGS

FIG. 5, is a diagram explaining the theory of an embodiment of this invention.

FIG. 6 shows an example of the system configuration of the embodiment of this invention.

FIGS. 7A, 7B and 7C show an example of data used in the embodiment.

FIG. 8 is a flowchart showing the process for the cell area restriction requirements judging module.

FIG. 12 shows the concept of the process for calculating the number of the existing cuts in one block to be divided by providing a new cut line.

FIG. 13 is a flowchart (No.1) showing the process for the existing cut position deciding module.

FIG. 16 is a theoretical configuration diagram of another embodiment of this invention.

DESCRIPTION OF THE PREFERRED EMBODIMENTS

Figure 1A:
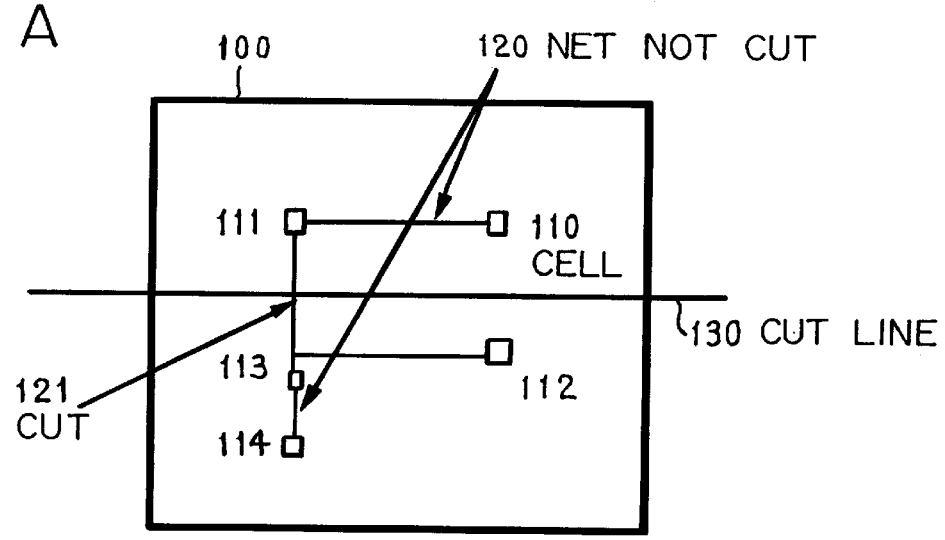
FIGS. 1A and 1B are diagrams explaining the Min-cut method.
Figure 1B:
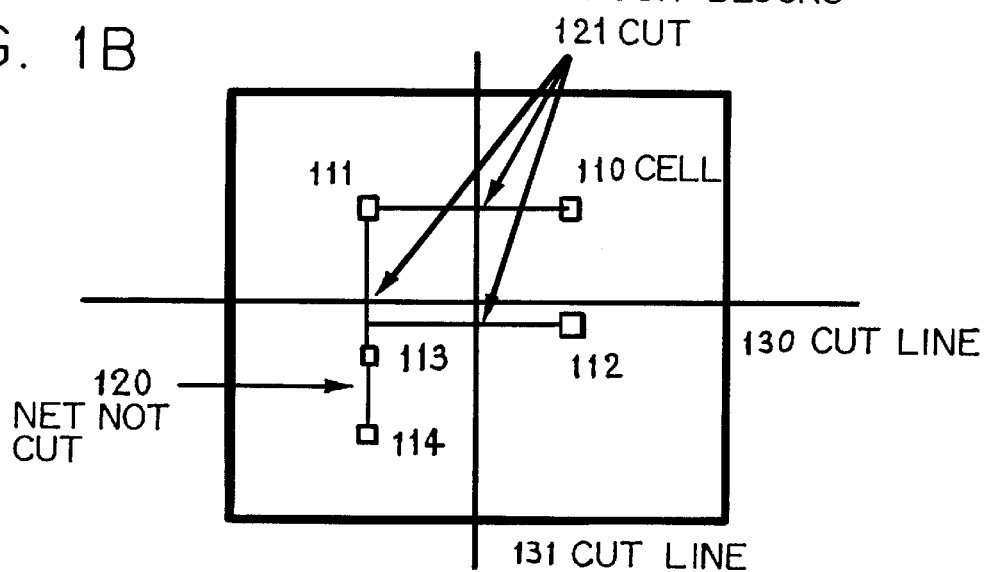
Figure 2:
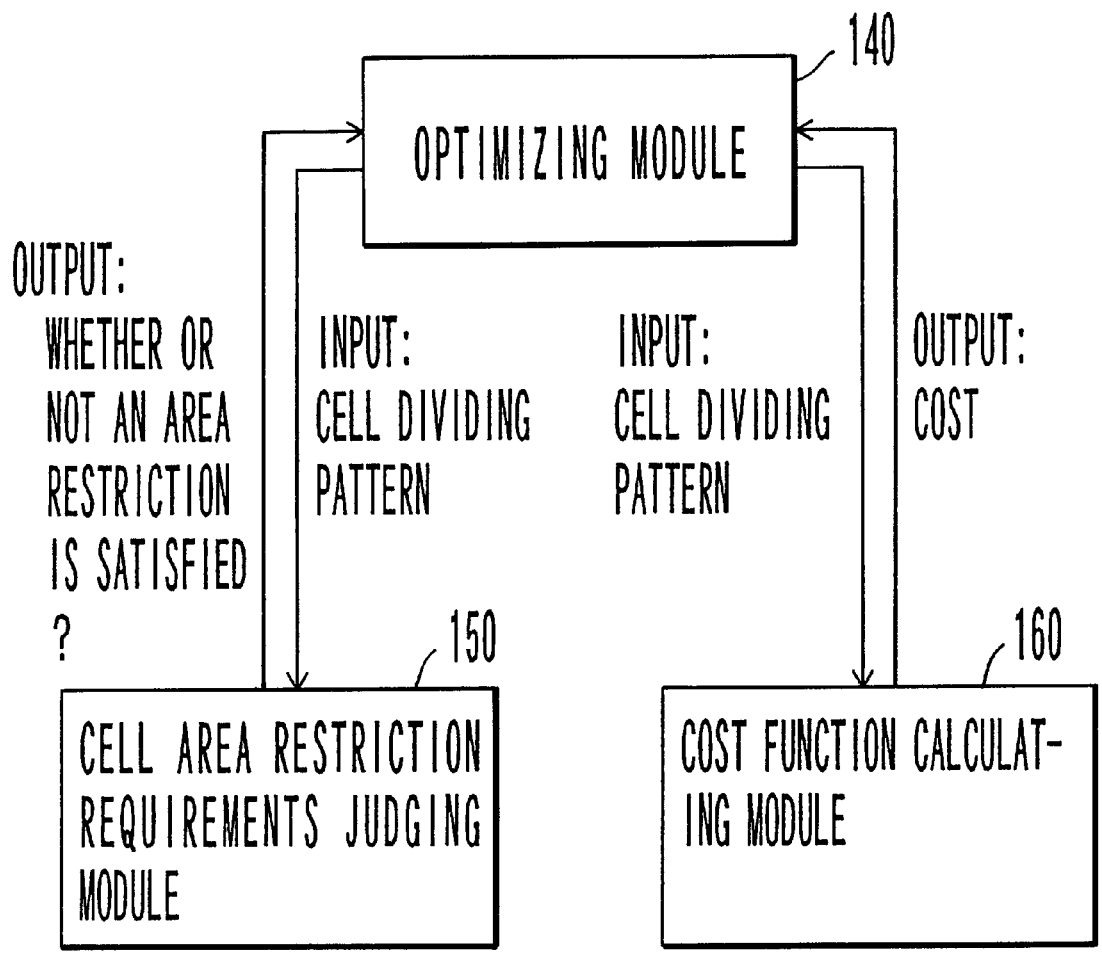
FIG. 2 is a diagram explaining the prior art.
Figure 3:
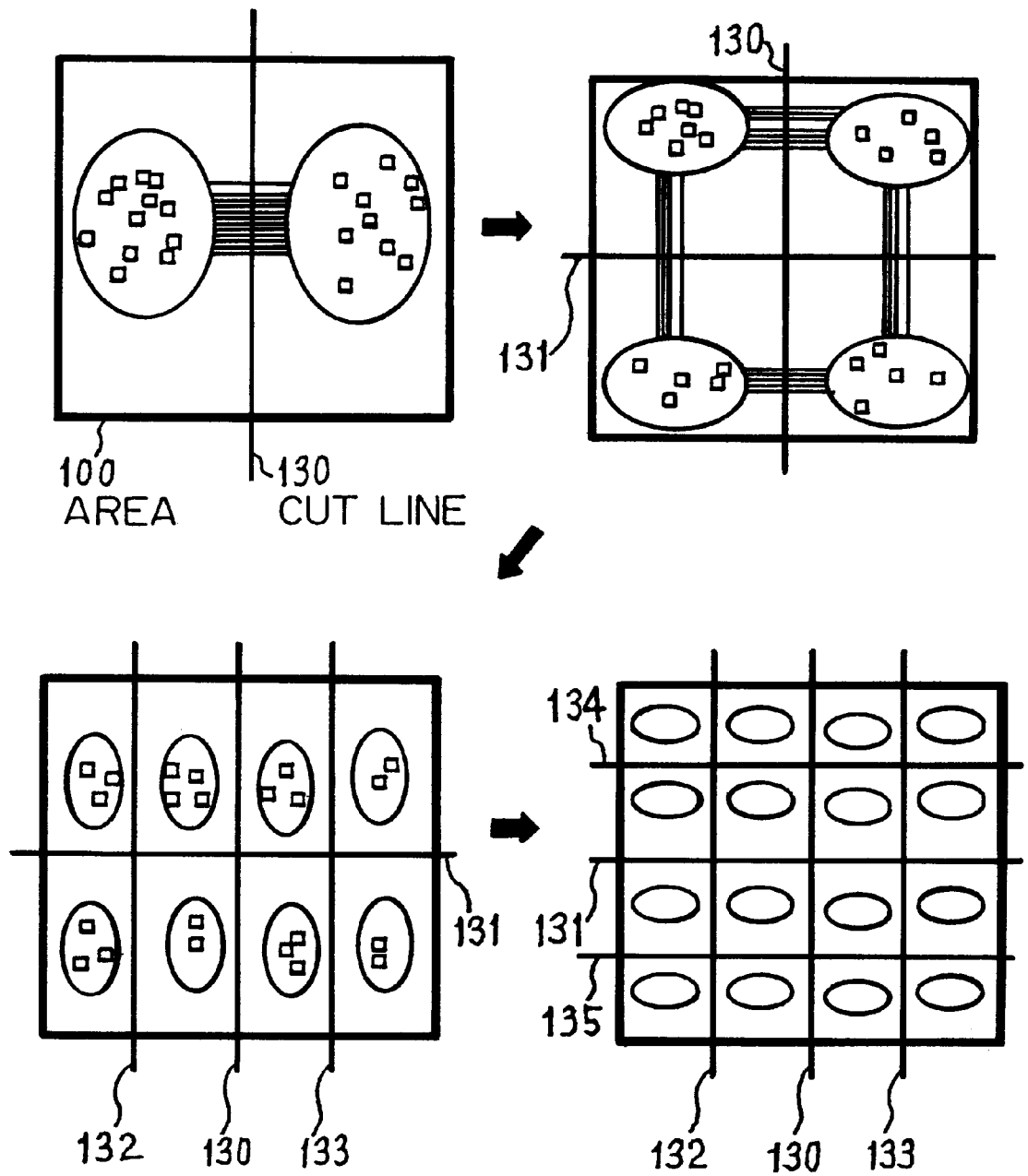
FIG. 3 is a diagram explaining the cell position decision by the conventional the Min-cut method.
Figure 4A:
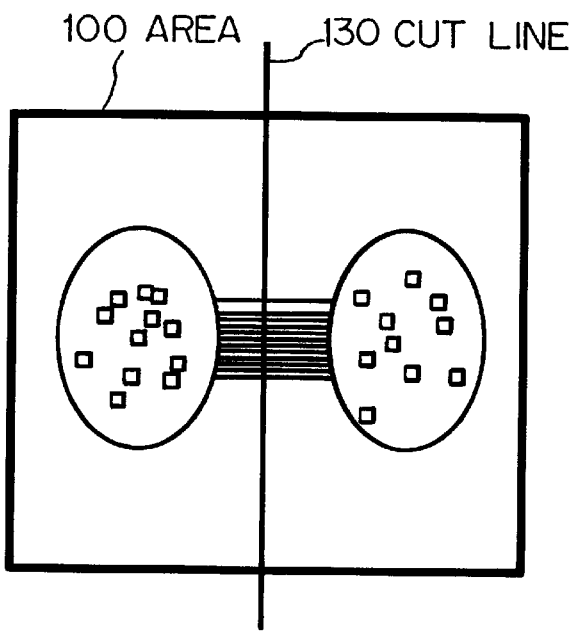
FIGS. 4A and 4B are diagrams explaining the case in which the existing cuts become unbalanced.
Figure 4B:
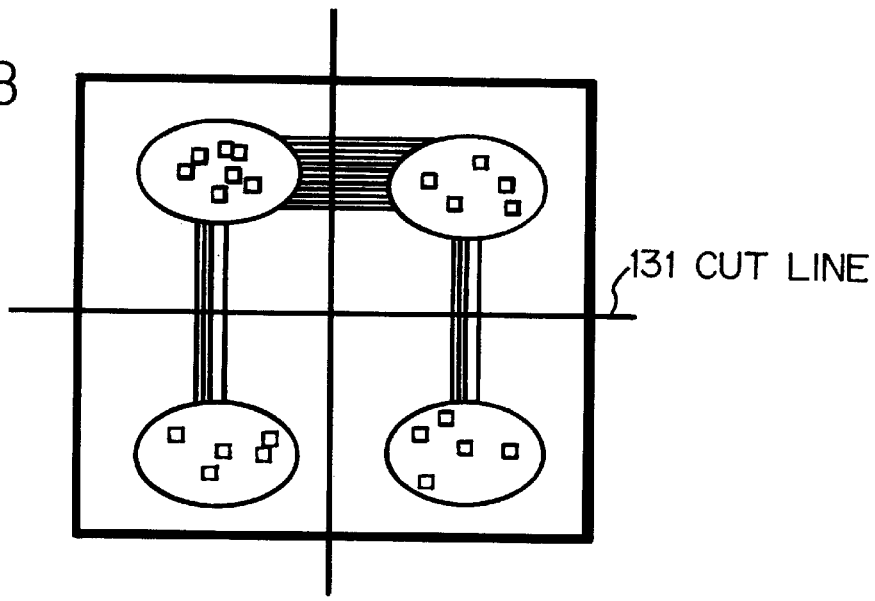

To solve the problems mentioned above the description of the preferred embodiments of this invention has units shown in FIG. 5.

FIG. 5 is a diagram explaining the theory of the embodiment of this invention. In FIG. 5, 1 indicates optimizing unit, 2 restriction requirements judging unit, 3 cost function calculating unit and 4 existing cut position deciding unit respectively.

Optimizing unit 1 is a module for dividing its area to which its cells are allocated (called a "block"), allocating each cell to the divided blocks and outputting its cell dividing pattern in order to decide the most suitable cell allocation. Optimizing unit 1 calls up restriction requirements judging unit 2 or cost function calculating unit 3, hands over its cell dividing pattern, and obtains notification on whether or not the predetermined cell area restriction requirements are satisfied and its cost calculated with the predetermined cost function from restriction requirements judging unit 2 and from cost function calculating unit 3 respectively.

Restriction requirements judging unit 2 is a unit for inputting the cell dividing pattern from optimizing unit 1 and judging whether or not its cell dividing pattern satisfies its predetermined cell area restriction requirements.

Restriction requirements judging unit 2 checks, for example, the restriction requirements in which the balance of the existing cuts are taken into consideration in addition to the conventional restriction requirements that the total area of its cells allocated to each block shall satisfy certain restriction requirements, judges whether or not the cell dividing pattern notified by optimizing unit 1 satisfies its cell area restriction requirement and outputs its judgement results to optimizing unit 1. The existing cut position calls up existing cut position deciding unit 4, hands over its cell dividing pattern to it and obtains notification from existing cut position deciding unit 4.

Cost function calculating unit 3 is a unit for inputting the cell dividing pattern from optimizing unit 1 and calculating the predetermined cost function for its cell dividing pattern. Cost function calculating unit 3 calls up existing cut position deciding unit 4, hands over its cell dividing pattern, calculates the cost function in which the existing cut position is obtained as an output and outputs its calculation results to optimizing unit 1.

Existing cut position deciding unit 4 is a unit for outputting the information on how the existing cuts are allocated by its cell pattern(existing cut position.)

In the first aspect of this embodiment, it is a key feature that the Min-cut method is executed incorporating the balance of the existing cuts into its restriction requirements. To be concrete, restriction requirements judging unit 2 checks the restriction requirements concerning the balance of the existing cuts in addition to the conventional cell area restriction requirements. Namely, it calls up existing cut position deciding unit 4 and judges whether or not the existing cuts are balanced, checking the existing cut position of its output. When it is balanced, it sends back to optimizing unit 1 the notification that its cell area restriction requirements are satisfied. When it is not balanced, it sends back to optimizing unit 1 the notification that its cell area restriction requirements are not satisfied.

Here, when dividing into two blocks, whether or not the existing cuts are balanced can be judged, for example, using the following equation. The expression |a| mentioned below means the absolute value of "a".

$$|C_1-C_2|<\epsilon$$

where $C_1$: Number of existing cuts allocated to Block 1

$C_2$: Number of existing cuts allocated to Block 2

$\epsilon$: Predetermined threshold value more than 0

Or the following equation can also be used taking into consideration the case when Block 1 and Block 2 are different in size.

$$|C_1/BL_1-C_2/BL_2|<\epsilon$$

where $C_1$: Number of existing cuts allocated to Block 1

$C_2$: Number of existing cuts allocated to Block 2

$BL_1$: Length of existing boundary of Block 1

$BL_2$: Length of existing boundary of Block 2

$\epsilon$: Predetermined threshold value more than 0

When it is divided into more than three blocks, it can also be judged in the same way.

Existing cut position deciding unit 4 executes a global routing process according to its input cell dividing pattern and obtains the global routing pattern of the existing cuts. The detailed explanation of methods for obtaining a global routing pattern, various kinds of which are known, shall be omitted here. For the details of the global routing process, see, for example, chapter 6 of "Algorithms for VLSI Physical Design Automation Second Edition" written by Naveed Sherwani and published by Klumer Academic Publishers. Where each cut should be positioned can be decided by this global routing pattern.

In the second aspect of this embodiment, when its cell allocation is decided, it is a key feature that the Min-cut method is executed based on this cost function using such a function so as to reduce its results while the numbers of the existing cuts are balanced. To be concrete, cost function calculating unit 3 calls up existing cut position deciding unit 4, obtains the existing cut position and uses such a function so as to reduce its results when the existing cuts are balanced as a cost function. Here, when it is divided into two blocks its cost function can be calculated using, for example, the following equation, where a shall be a positive constant:

$$\text{Cost}=\text{Existing cost}+\alpha\times|C_1-C_2|$$

Or the following equation can be used, taking into consideration when Block 1 and Block 2 are different in size:

$$\text{Cost}=\text{Existing cost}+\alpha\times|C_1/BL_1-C_2/BL_2|$$

where $C_1$, $C_2$, $BL_1$ and $BL_2$ indicate the same as those in the equation mentioned before.

When it is divided into more than three blocks, its cost can also be calculated in the same way.

As mentioned above in this invention because its dividing process is executed by the Min-cut method taking into consideration the balance of the existing cuts, its net density is averaged and its routing becomes easy to make.

FIG. 6 shows an example of the system configuration of this embodiment.

In FIG. 6, 10 indicates a cut minimizing module for realizing a process related to this invention, 11 an optimizing module corresponding to the optimizing unit shown in FIG. 5, 12 a cell area restriction requirements judging module corresponding to restriction requirements judging unit 2 shown in FIG. 5, 13 a cost function calculating module corresponding to cost function calculation unit 3, 14 an existing cut position deciding module corresponding to existing cut position deciding unit 4, 20 a main module for deciding which block to cut next, which includes global routing module 21, 30 a cell allocation control module for checking to which block each cell belongs, 40 a processing device consisting of a CPU and a memory, 41 an input/output device such as a display and keyboard and 42 an external memory device such as a magnetic disk device, respectively.

Cut minimizing module 10 is a process module for minimizing the number of cuts in a target block, and is provided with optimizing module 11, cell area restriction requirements judging module 12, cost function calculating module 13 and existing cut position deciding module 14. Cut minimizing module 10 obtains a block to be cut from main module 20, processes block division optimally and outputs its division results to main module 20.

Optimizing module 11 calls up cell area restriction requirements judging module 12, hands over its cell dividing pattern to it, obtains its judgement on whether or not the predetermined cell area restriction requirements are satisfied and searches for the optimization of its cell allocation.

Cell area restriction requirements judging module 12 is a process module for inputting the cell dividing pattern from optimizing module 11 and judging whether or not its cell dividing pattern satisfies its cell area restriction requirements.

Cost function calculating module 13 is a module for inputting its cell dividing pattern from optimizing module 11 and calculating the predetermined cost function for its cell dividing pattern.

Existing cut position deciding module 14 is a process module for outputting how the existing cuts are allocated (existing cut position) by inputting the cell dividing pattern from cell area restriction requirements judging module 12 or cost function calculating module 13, referring to data which cell allocation control module 30 controls according to its cell dividing pattern and executing said global routing process.

Main module 20 is a process module for outputting the final results of the cell allocation by inputting a net list which is data showing the relationship of its cell combination externally, controlling which block to cut, handing over information on the block to be cut to cut minimizing module 10, re-allocating its cells so as to optimize its cell allocation and repeating this.

Main module 20 is provided with global routing module 21. Global routing module 21 is a module for checking whether or not there are any cuts crossing the boundary of the divided blocks when existing cut position deciding module 14 checks the existing cut positions using said global routing method. For example, when there is a specified net crossing the right neighborhood of the block, the number of the existing cuts to be checked, data that the specified net has a cut in the right neighborhood of this block shall be searched for. Such data are searched for all the nets and are given to existing cut position deciding module 14. Existing cut position deciding module 14 searches the existing cut positions for a specified block based on this information, and gives them to cell area restriction requirements judging module 12 and cost function calculating module 13.

Cell allocation control module 30 stores and controls data on where each cell processed by optimizing module 11 belongs.

To simplify the explanation, for example, a case where the target area of its cell allocation is divided into two blocks of Block 0 and Block 1 is explained below.

(1) Examples of data configuration

FIGS. 7A,7B and 7C show an example of data used in the embodiment. Data on how many cells connected to its net belong to each of two blocks are stored for each net and further that on whether or not the existing cuts are provided is stored. To be concrete, the following data shown in FIG. 7A are used.

They are a list of cell numbers connected to a net (its data name is "celllist".), the number of cells in Block 0 (its data name is "cellnum0".), the number of cells in Block 1 (its data name is "cellnum1".), data which are set to TRUE and FALSE when the existing cuts are and are not on the right side respectively (its data name is "outright".) and data which are set to TRUE and FALSE when the existing cuts are and are not on the left side respectively (its data name is "cutleft".). When the existing cuts on upper and lower sides should be taken into consideration, variables holding data corresponding to each of cutright and cutleft are provided. However, to simplify the explanation examples in which the existing cuts on right and left sides should be taken into consideration are shown here.

Cellnum0 and cellnum1 are data stored in cell allocation control module 30.

Judgement on whether or not a net is cut can be made as shown in FIG. 7B using the above data. Namely, when cellnum0=0 and cellnum1>0, the net belongs to Block 1. When cellnum0>0 and cellnum1=0, the net belongs to Block 0 and when cellnum0>0 and cellnum1>0, the net is cut.

Therefore, by judging the values of cellnum0 and cellnum1, whether or not the net is currently cut can be judged and by making this judgement for all the nets, the number of cuts can be calculated.

In the same way, the values of cutright and cutleft can be calculated based on the number of cells belonging to each surrounding block. The number of cells existing in each surrounding block is managed by cell allocation control module 30.

As shown in FIG. 7, for each cell it has a list of net numbers connected to its cell (its data name is "netlist") and the data on which block the cell currently belongs to ("its data name is "block").

How the number of cuts of a cell varies when moving cells can be calculated by subtracting the value after the movement from that before the movement, after checking for each net in its netlist whether or not it is cut before or after the movement, and calculating the total value of the number of its cuts.

(2) Cell area restriction requirements judging module

Cell area restriction requirements judging module 12 incorporates the balance of the existing cuts into its cell area restriction requirements in addition to the process for judging the conventional cell area restriction requirements.

Cell area restriction requirements judging module 12 calls up existing cut position deciding module 14, hands over its cell dividing pattern to it, obtains the existing cut position as its output results, judges whether or not a target cell dividing pattern satisfies its cell area restriction requirements, while taking the existing cut positions into consideration, and outputs its judgement results to optimizing module 11.

FIG. 8 is a flowchart showing the process for the cell area restriction requirements judging module 12. In FIG. 8 at step S1 a check is executed by ordinary cell area restriction requirements. For example, it checks whether or not the following equation is satisfied for a constant $e_1$ larger than 0 (threshold value).

$$|V_0 - V_1| < e_1$$

where $V_0$: Total of cell areas allocated to Block 0
$V_1$: Total of cell areas allocated to Block 1

At step S2, it is judged whether or not ordinary cell area restriction requirements are satisfied as a result of the check by step S1. When $|V_0 - V_1| < e_1$, the process goes to step S3, because its cell area restriction requirements are satisfied. When $|V_0 - V_1| \geq e_1$, it goes to step S6, because this requirement is not satisfied.

At step S3, existing cut position deciding module 14 is called up with designating a cell dividing pattern, and information on the existing cut position is obtained.

At step S4, it is judged whether or not the existing cuts are balanced. For example, it is judged whether or not the following equation is satisfied for a constant $e_2$ larger than 0.

$$|C_0 - C_1| < e_2$$

where $C_0$: Number of existing cuts allocated to Block 0

$C_1$: Number of existing cuts allocated to Block 1

As its judgement results when $|C_0-C_1|<e_2$, it goes to step S5, because its restriction requirements concerning the balance of the existing cuts are satisfied. Then optimizing module 11 is notified that the current cell dividing pattern satisfies the cell area restriction requirements, and the process is terminated. In other cases it goes to step S6, optimizing module 11 is notified that the cell area restriction requirements are not satisfied and the process is terminated.

(3) Cost function calculating module

In addition to the cost based on the conventional number of cuts, cost function calculating module 13 uses the cost function in which a cost due to the balance of the existing cuts is taken into consideration.

Cost function calculating module 13 calls up existing cut position deciding module 14, hands over its cell dividing pattern to it and as its output results obtains the existing cut position. Then, it calculates its cost function based on the information of its existing cut position and outputs its calculated cost to optimizing module 11.

First, examples of the cost function in the conventional Min-cut method are shown.

(a) Simplest case

In the simplest case the cost function is "cost=number of cuts". The larger the number of cuts, the bigger its cost shall be.

(b) When a weight is attached to the net which should be as short as possible.

For example, the cost when a weight is attached to the net which should be as short as possible, is as follows.

$$\text{Cost} = \Sigma W_i$$

where $\Sigma$ and $W_i$ are the sum total of all net i cuts and the weight determined for net i, respectively. It is because an increased delay due to an increased length of a net is often problematic that weight $W_i$ is used in order to reduce the probability that its net might be cut by using a big $W_i$ for the net in which an increased delay is problematic (critical net).

(c) When an area balance is taken into consideration in its cost function

An example of when an area balance is taken into consideration in its cost function by the conventional Min-cut method is explained. In this case if it is assumed that a circuit is divided into Block 0 and Block 1, and that $V_0$ and $V_1$ are the total of the cell areas allocated to Block 0 and Block 1 respectively, its cost is calculated as follows:

$$\text{Cost} = \text{Number of cuts}/(|V_0| \times |V_1|)$$

A division in which its cost is minimal shall be searched for using this cost function. Because in this cost function its value goes up when its area balance is bad, as a result an answer with a good balance can be obtained. This is called the Ratio-Cut method which is a well-known method.

In this invention, to take into further consideration the balance of the existing cuts, a cost obtained from the balance of the existing cuts is added to the cost of the conventional cost function mentioned above (called "originalCost"). Assuming that a circuit is divided into two blocks of Block 0 and Block 1, and that the number of the existing cuts belonging to Block 0 and Block 1 are cut0 and cut1 respectively, several examples are explained.

(a) When the difference between cut0 and cut1 is assumed as its cost $$\text{Cost} = \text{originalCost} + \alpha \times |\text{cut0} - \text{cut1}|$$

where $\alpha$ is a positive real number. When you want to attach importance to the balance of the existing cuts and originalCost, increase and decrease the value of $\alpha$, respectively.

(b) When the squared difference between cut0 and cut1 is assumed as its cost $$\text{Cost} = \text{originalCost} + \alpha \times (\text{cut0} - \text{cut1})^2$$

When the difference between cut0 and cut1 is small, it is not so problematic. Therefore, if the squared difference between cut0 and cut1 is used, there is hardly any influence on cost when the difference between cut0 and cut1 is small. If the difference between cut0 and cut1 is big, its cost increases rapidly. Accordingly, when the difference between cut0 and cut1 is small, the force which tries to balance them becomes small. On the other hand, when the difference between cut0 and cut1 is big, it tends to overbalance them.

Figure 9:
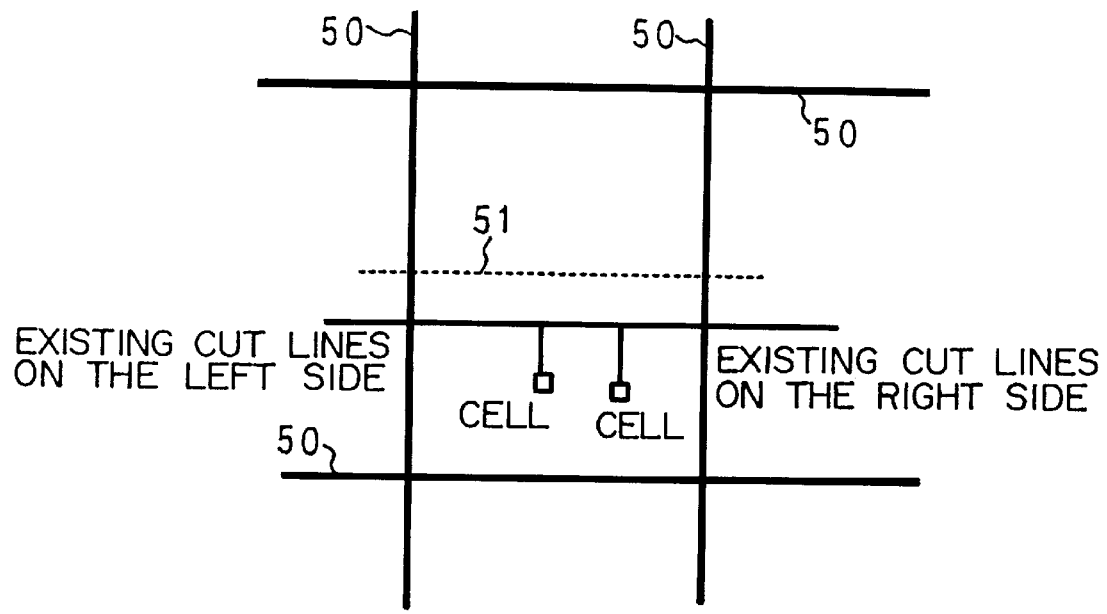
FIG. 9 shows an example of the cell dividing pattern when there are existing cuts on the right and left side.

(c) As shown in FIG. 9 in this case, for example, cut0right, cut0left, cut1right and cur1left are used, taking into consideration the fact that there may be existing cuts on both the right and left sides.

cut0right: Number of the existing cuts belonging to the right side of Block 0 cut0left: Number of the existing cuts belonging to the left side of Block 0 cut1right: Number of the existing cuts belonging to the right side of Block 1 cut1left: Number of the existing cuts belonging to the left side of Block 1

FIG. 9 shows an example of a cell dividing pattern when there are existing cuts on the right and left sides. In the FIG. 50 indicates a cut line which has already divided and 51 one that is currently going to divide respectively. Taking into consideration a case as shown in FIG. 9, for example, the following cost function is used:

$$\text{Cost} = \text{originalCost} + \alpha \times (|\text{cut0right} - \text{cut1right}| + |\text{cut0left} - \text{cut1left}|)$$

Thus, the balance of the existing cuts can be taken into consideration on each of the right and left sides separately.

Figure 10:
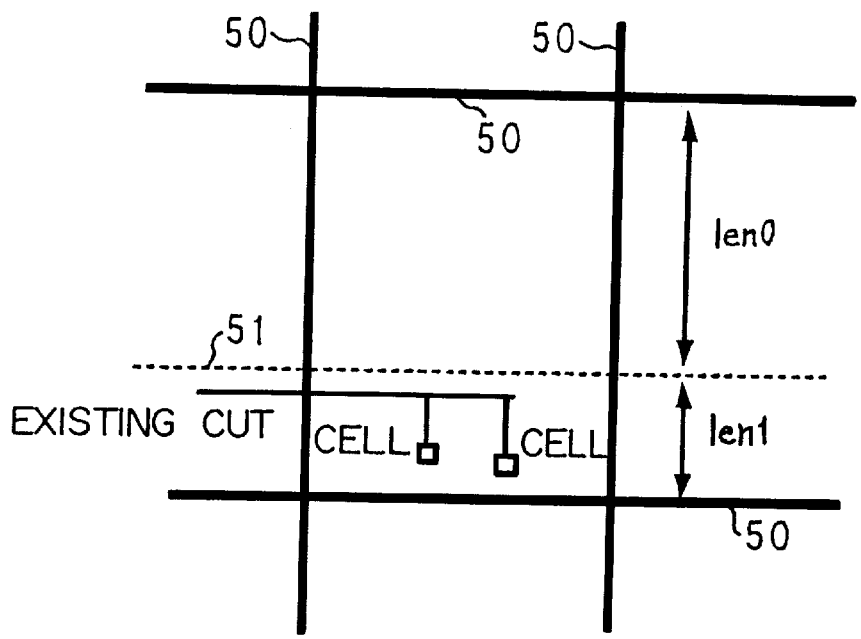
FIG. 10 shows an example of the cell dividing pattern when its blocks are different in size.

(d) As shown in FIG. 10, for example, the number of existing cuts per unit length is used taking into consideration the case when the size of the blocks of its cell dividing pattern differs.

FIG. 10 shows an example of its cell dividing pattern when the size of its blocks differs. In FIG. 10, 50 indicates a cut line which has already divided, 51 one that is currently going to divide, len0 the height of Block 0 and len1 the height of Block 1 respectively.

In a case like this it is effective in averaging the existing cuts, for example, to use the following cost function:

$$\text{Cost} = \text{originalCost} + \alpha \times |\text{cut0}/\text{len0} - \text{cut1}/\text{len1}|$$

Figure 11:
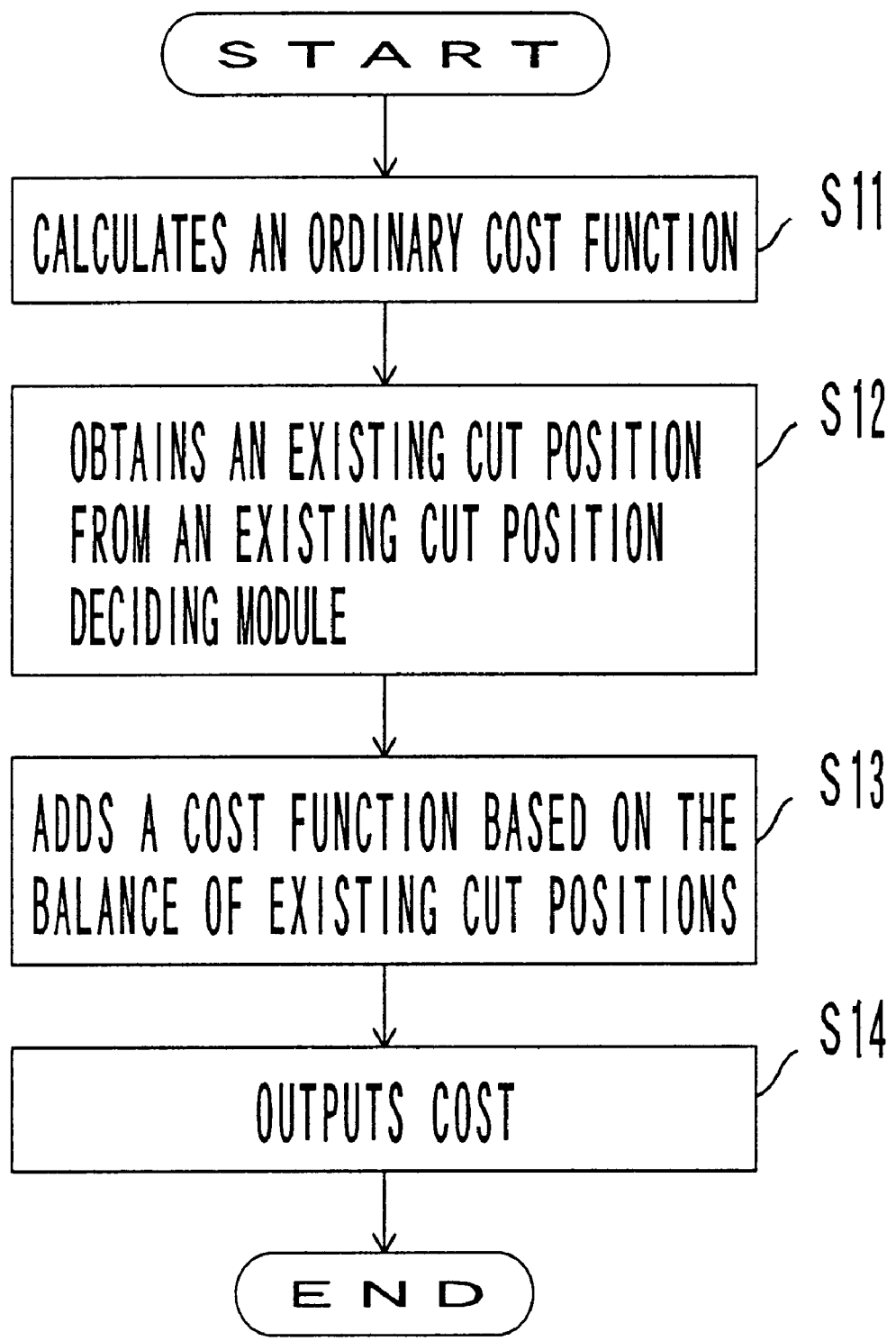
FIG. 11 is a flowchart showing the process for the cost function calculating module.

FIG. 11 is a flowchart showing the process for the cost function calculating module.

In FIG. 11, step S11 calculates its cost using an ordinary cost function used conventionally.

At step S12, it calls up existing cut position deciding module 14 and obtains the existing cut positions from existing cut position deciding module 14.

At step S13, it calculates the cost on the balance of the existing cuts and adds it to the cost calculated at step S11.

At step S14, it outputs the cost to optimizing module 11.

(4) Existing cut position deciding module 14

How the number of its cuts varies when a cell is moved can be obtained by subtracting the value after the movement from that before the movement, after calculating whether or not it is cut before or after the movement for each net contained in netlist (a list of net numbers connected to a cell) and obtaining the total value of the number of its cuts.

FIG. 12 shows the concept of the process of calculating the number of the existing cuts in one of the blocks divided by providing a new cut line.

The process in which the balance of the existing cuts in blocks divided by a newly provided cut line is checked is executed by checking the blocks divided by this cut line one by one. One of the enlarged blocks, divided by a newly provided cut line when a cut line is provided in such a state where the entire chip is already divided by several cut lines, is shown in FIG. 12.

First, global routing module 21, mentioned in FIG. 6, is called up and information on the block which is currently focused is given. Global routing module 21 wires the entire chip roughly and generates information on by which cut line a net on the net list is cut.

This information is handed over to existing cut position deciding module 14. Existing cut position deciding module 14 checks whether or not there are any cuts by checking the values of cellnum0 and cellnum1 in both currently focused and neighboring blocks shown in FIG. 7B. By executing this process for all nets it can be judged whether or not there are any cuts between the currently focused block and one neighboring block. This cut is an existing cut, because it has been obtained for the already divided block.

Because existing cut position deciding module 14 can obtain information on where in the currently focused block there are existing cuts of which net from global routing module 21, it is also judged whether or not there are any cells connected to the focused net above or below a newly provided cut line. Using these results it is checked how many existing cuts there are on the right side of the newly divided block above, on the left side of the block, and on the right and left sides of the newly divided block below respectively, and they are output.

Because, in FIG. 12, a newly provided cut line divides a block horizontally, it is judged whether or not there are any cells above or below it. When a new cut line divides a block vertically, it is judged whether or not there are any cells on its right or left sides. However, because a process for judging whether or not the existing cut is on the right or left side of the block, and that whether or not it is above or below the block are the same if the block is rotated by 90 degrees, only the process for checking how many existing cuts there are on the right and left sides of the block respectively, when the focused block is divided vertically, is explained below.

Figure 14:
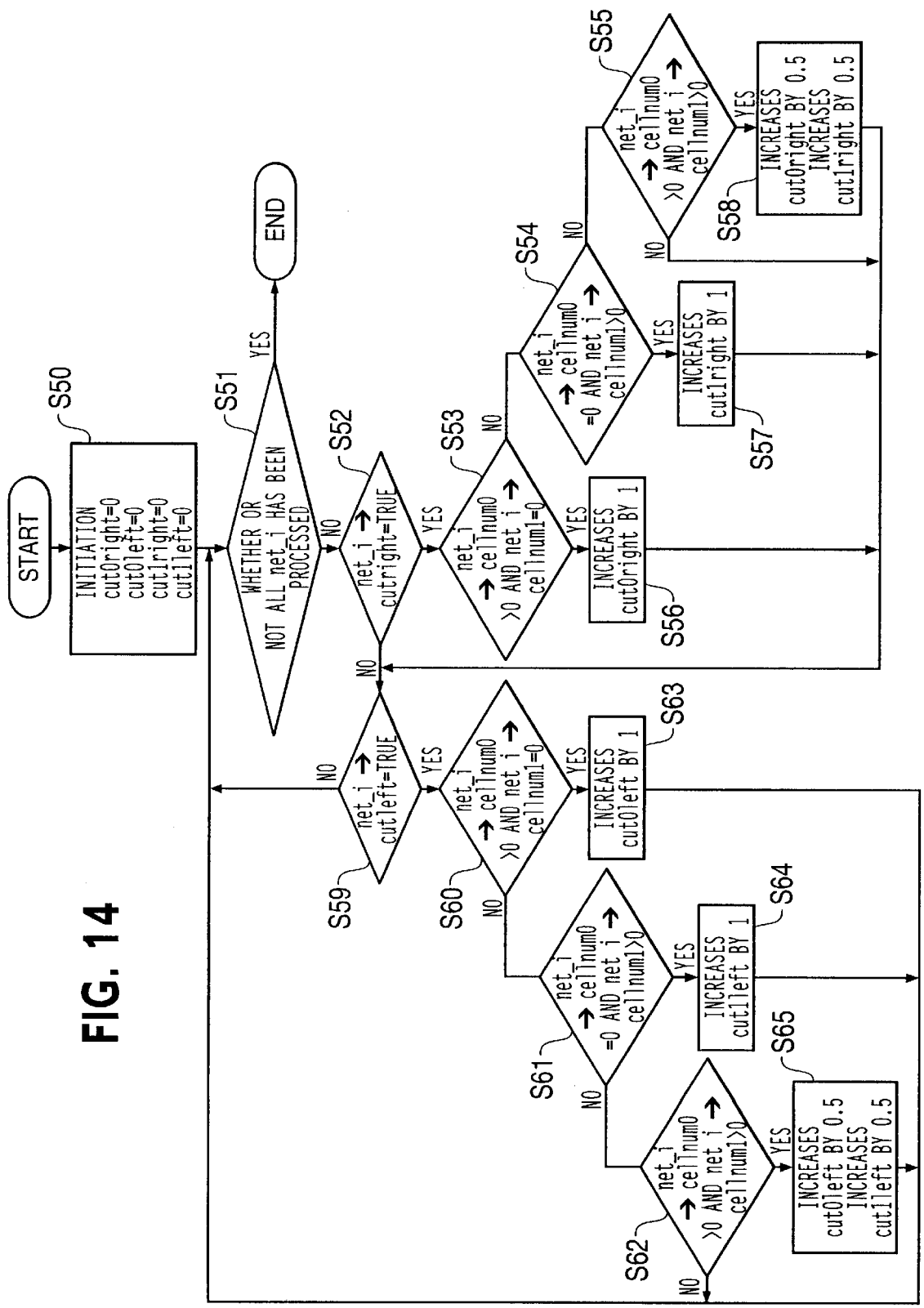
FIG. 14 is a flowchart (No.2) showing the process for the existing cut position deciding module.

FIGS. 13 and 14 are flowcharts showing the process of existing cut position deciding module 14.

Although the process in FIG. 13 is repeatedly executed for all the nets in a net list, only the process for a net specified by variable i is described below.

In step S40, existing cut position deciding module 14 inquires of global routing module 21 whether or not net i has the existing cuts on the right side of the currently focused block. In step 41, it judges from the results of the inquiry whether or not net i has the existing cuts on the right side of the currently focused block. When it has the existing cuts, "TRUE" shall be set to net_i→cutright (step S42). When it does not have the existing cuts, "FALSE" shall be set to net_i→cutright (step S43). Here, a variable of net_i→cutright indicates whether or not net i has the existing cuts on the right side of the currently focused block (a block previously divided by a new cut line.)

Next, in step S44, existing cut position deciding module 14 inquires of global routing module 21 whether or not net i has the existing cuts on the left side of the currently focused block. In step S45, it judges from the results of the inquiry whether or not net i has the existing cuts on the left side of the currently focused block. When it has the existing cuts, "TRUE" shall be set to net_i→cutleft (step S46.) When it does not have existing cuts, "FALSE" shall be set to net_i→cutleft (step S47.) Here, a variable of net_i→cutright indicates whether or not net i has the existing cuts on the left side of the currently focused block (a block previously divided by a new cut line.)

Next, existing cut position deciding module 14 executes the process in FIG. 14 based on the information obtained in FIG. 13.

Namely, first, in step S50, it initiates all of cut0right, cut0left, cut1right and cut1left into "0". Here, cut0right indicates the number of the existing cuts on the right side of the block (Block 0) made above a newly provided cut line out of the currently focused blocks. In the same way cut0left indicates the number of the existing cuts on the left side of the block above (Block 0), cut1right that on the right side of the block below (Block 1) and cut1left that on the left side of the block (Block 1) respectively. Of course, one could suppose that they should indicate the number of the existing cuts on the upper and lower sides of the block contrary to the above definition.

In step S51, it is judged whether or not this process has been executed for all net i and when it has been executed for all net i, it is terminated. When it has not been executed for all net i, in step S52 it is judged whether or not net_i→cutright obtained in the process in FIG. 13 is set to "TRUE." When it is not set to "TRUE", the process goes to step S59, because net i dose not have the existing cuts on the right side of the currently focused block.

When it is set to "TRUE" in step S52, in step S53, it is judged whether or not net_i→cellnum0 is greater than "0" and that net_i→cellnum1 is "0". This means it is judged that the number of cells connected to net i in Block 0 is greater than "0", and that in Block 1 is "0". When the judgement in step S52 is YES, it means that there are some cells connected to net i in Block 0 and no cells in Block 1, and that net i has the existing cuts on the right side of Block 0. Accordingly, cutoright is increased by one (step S56), and it goes to step S59.

When the judgement in step S52 is NO, in step S54 it is judged that there are no cells connected to net i in Block 0 and whether or not there are any cells connected to net i in Block 1. When the judgement in step S54 is YES, it means that net i has the existing cuts on the right side of Block 1. Accordingly, cut1right shall be increased by one (step S57) and it goes to step S59.

When the judgement in step S54 is NO, in step S55, it is judged whether or not there are any cells connected to net i in both Block 0 and Block 1. When the judgement in step S55 is NO, it goes directly to step S59 and when it is YES in step S58 both cut0right and cut1right are increased by 0.5, and the process goes to step S59. This is because in step S58 it is not judged whether net i has the existing cuts on the right side of Block 0 or on the right side of Block 1. However, when existing cut position deciding module 14 is implemented, it is set so that information that they can be allocated in either block may be stored, and it can be used as an adjusting cut for when the numbers of the existing cuts in Block 0 and Block 1 are balanced.

In step S59, it is judged whether or not net_i→cutleft, obtained in the process of FIG. 13, is set to "TRUE" and whether or not net i has the existing cuts on the left side of the currently focused block. When the judgement in step S59 is NO, it goes back to step S51.

When the judgement in step S60 is NO, in step S61, it is judged that there are no cells connected to net i in Block 0 and whether or not they exist in Block 1. When the judgement in step S61 is YES, it is judged that net i has the existing cuts on the left side of Block 1. Accordingly, cut1left is increased by one (step S64), and it goes back to step S51.

When the judgement in step S61 is NO, in step S62, it is judged whether or not there are any cells connected to net i in both Block 0 and Block 1. When the judgement in step S62 is NO, it goes back to step S51. When the judgement in step S62 is YES, in step S65, both cut0left and cut1left are increased by 0.5, and it goes back to step S51. As mentioned in steps S55 and S58, in its actual implementation, the judgement results in step S62 can be positively used.

As mentioned above existing cut position deciding module 14 can calculate the number of the existing cuts in each block using the method mentioned above.

(5) Optimizing module 11

Figure 15:
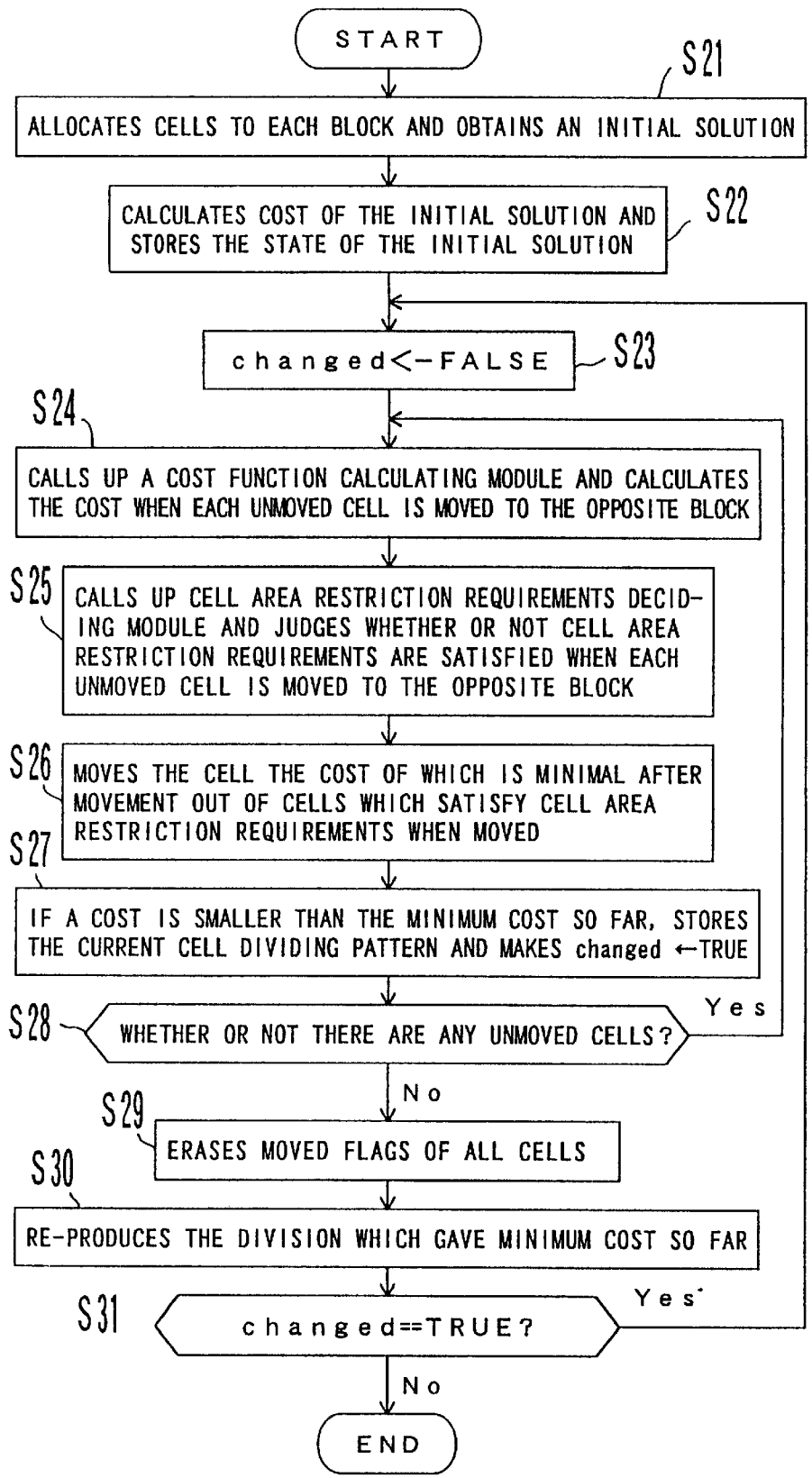
FIG. 15 is a flowchart showing the process for the optimizing module.

FIG. 15 is a flowchart showing the process for the optimizing module.

Optimizing module 11 executes the following processes obtaining information on the block to be cut from main module 20.

First, in step S21 of FIG. 15, it randomly allocates its cells to each divided block and obtains its initial solution.

In step S22, it calculates the cost on the initial solution, notifies cell allocation control module 30 of the state of the initial solution and stores it. Next, the following processes are repeated.

In step S23, it sets the flag named "changed", to show whether or not there are any changes in its cell dividing pattern, to "FALSE(no change)."

In step S24, it calls up cost function calculating module 13 and calculates how much the cost is when each unmoved cell is moved to the block on the opposite side.

In step S25, it calls up cell area restriction requirements deciding module 12 and judges whether or not its cell area restriction requirements are satisfied when each unmoved cell is moved to the block on the opposite side.

In step S26, it moves the cells the cost of which is minimal after the movement out of the blocks which satisfies the cell area restriction requirements when moved, to the block on the opposite side.

In step S27, if the cost is smaller than the minimum cost so far when the cell is moved, it stores the current cell dividing pattern in cell allocation control module 30 and sets the flag named "changed" to "TRUE(changed)."

In step S28, it judges whether or not there are any unmoved cells. This is done by preparing a flag indicating a cell moved for each cell. If there are any unmoved cells, the process goes back to step S24 and the same processes are repeated. When all the cells are moved, the process goes to step S29.

In step S29, it erases the flag of all cells and prepares for the movement process of the next cell.

In step S30, it reproduces the cell dividing pattern in which its cost becomes minimal so far.

In step S31, it judges whether or not the flag "changed" is set to "TRUE." If it is set to "TRUE", it goes back to step S23 and repeats the same processes. If it is not set to "TRUE", it is terminated, because there is no more suitable cell dividing pattern than the one reproduced in step S30.

In step S25 above, it is judged with the restriction requirement on the total of its cell areas allocated to each block only in the prior art, whereas, in the first embodiment of this invention, it is judged with further including the balance of the existing cuts to it, which is one of the greatest features of this invention.

In step S24 above, its cost is calculated based on the number of cuts in the prior art, whereas, in the second embodiment of this invention, its cost is calculated further based on the cost function in which its results become minimal when the existing cuts are balanced, which is also one of the features of this invention.

FIG. 16 is a theoretical configuration diagram of another embodiment of this invention.

The theoretical configuration of this embodiment corresponds to FIG. 5 of the embodiment mentioned above. The description of the embodiment mentioned above includes a process for averaging the total area in a block occupied by its cells in addition to one for balancing the number of the existing cuts, whereas this embodiment takes into consideration, only the balance of the number of the existing cuts.

As explained in FIG. 5, optimizing unit 50 is for dividing blocks to which its cells are allocated, allocating each cell to the divided blocks and outputting the most suitable cell dividing pattern in order to decide on the most suitable cell allocation. Optimizing unit 50 calls up existing cut number requirements deciding unit 51 and cost function calculating unit 52, hands over the cell dividing pattern to it, and obtains information on whether or not the existing cut number requirements are satisfied and the cost calculated by the predetermined cost function from existing cut number deciding unit 51 and cost function calculating unit 52 respectively. Existing cut position deciding unit 53 is for outputting information on how the existing cuts are allocated by the cell dividing pattern, i.e. its existing cut position, by receiving the cell dividing pattern from existing cut number requirements deciding unit 51 or cost function calculation unit 52.

In this embodiment the explanations on optimizing unit 50, cost function calculating unit 52 and existing cut position deciding unit 53 shall be omitted, because they are the same as those of the embodiment mentioned above.

Existing cut number requirements deciding unit 51 checks restriction requirements in which the balance of the existing cuts is taken into consideration and outputs its judgement results to optimizing unit 50. The existing cut position is notified by existing cut position deciding unit 53 by calling up existing cut position deciding unit 53 and handing over the cell dividing pattern to it.

The process of existing cut number requirements deciding unit 51 is executed by judging whether or not, for example, the following equations are satisfied, as mentioned before:

$$|C_1 - C_2| < \epsilon$$

or $$|C_1/BL_1 - C_2/BL_2| < \epsilon$$

where $C_1$ and $C_2$ are the number of the existing cuts allocated to Block 1 and Block 2, respectively, $BL_1$ and $BL_2$ the length of the existing boundary lines in Block 1 and Block 2, respectively, and $\epsilon$ the predetermined threshold value which is more than 0, respectively.

Although in the preferred embodiments mentioned previously, it is judged whether or not its cell area restriction requirements are also satisfied in addition to the requirement for restricting the balance of the number of said existing cuts, but in this embodiment such a judgement is not made.

Cost function calculating unit 52 is used to obtain such a cell allocation as to minimize the number of its cuts using such a function in which the smaller the number of cuts on the cut line, the smaller the absolute value of a function.

Therefore, optimizing unit 50 obtains a judgement on the balance of the number of the existing cuts from existing cut number requirements deciding unit 51, obtains such a function value (cost) as to minimize the number of the existing cuts and optimizes its cell allocation. In this way the cell allocation, in which the number of existing cuts is balanced among its blocks and that the number of cuts is small, can be obtained.

Because an example of the system configuration of this embodiment can be obtained by replacing cell area restriction requirements judging module 12 with a module with a function corresponding to said existing cut number requirements deciding unit 51, its detailed explanation shall be omitted.

As explained above, because a process using the Min-cut method can be executed taking the balance of the existing cuts into consideration in this invention, the density of its nets can be averaged and its routing can be made easily.

What is claimed is:

1. A method of optimizing a cell allocation in the designated area by a computer using the Min-cut method, comprising the steps of:

allocating cells to each divided area and moving already allocated cells among divided areas;

judging whether or not restriction requirements on the total of cell areas allocated to said divided areas as well as restriction requirements on the balance of the existing cuts which are nets crossing a cut line for dividing said designated areas are satisfied; and re-allocating the cells to said divided areas or moving the cells among said divided areas unless said restriction requirements are satisfied.

2. A method of optimizing a cell allocation in the designated area by a computer using the Min-cut method, comprising the steps of:

allocating cells to each divided area and moving already allocated cells among the divided areas;

calculating a cost using such a cost function so as to reduce its resulting cost when the existing cuts which are nets crossing a cut line for dividing said designated area concerning the allocation of the cells are allocated to said divided areas; and searching for such a cell allocation so as to reduce said cost by re-allocating the cells to said divided areas and moving the cells among said divided areas.

3. An apparatus for optimizing a cell allocation in the designated area using the Min-cut method, comprising:

an existing cut position deciding means for inputting a cell dividing pattern for showing the state where cells are allocated to each divided area and deciding the position of the existing cuts;

a restriction requirements judging means for judging the predetermined restriction requirements on whether or not the positions of the existing cuts, which said existing cut position deciding means has decided, are balanced; and an optimizing means for generating other cell dividing patterns and controlling the repetition of the processes of said restriction requirements judging means and said existing cut position deciding means when it is judged that said restriction requirements do not satisfy the predetermined restriction requirements.

4. An apparatus for optimizing a cell allocation in the designated area using the Min-cut method, comprising:

an existing cut position deciding means for inputting a cell dividing pattern for showing the state where cells are allocated to each divided area and deciding the position of the existing cuts;

a cost function calculating means for calculating a cost for the current cell dividing pattern using such a cost function as to reduce its resulting cost when the existing cuts, which said existing cut position deciding means has decided, are balanced; and an optimizing means for generating other dividing patterns and controlling the repetition of the processes of said cost function calculating means and said existing cut position deciding means.

5. A method of optimizing a cell allocation using the Min-cut method, comprising the steps of:

setting a cut line for dividing the area in which cells connected by plural nets are allocated;

calculating the number of the existing cuts contained in the first and second blocks generated by dividing said area with said cut line;

judging whether or not the number of the existing cuts in the first and second blocks satisfy an optimizing requirements; and modifying said cell allocation so that the number of the existing cuts in said first and second blocks satisfies the optimizing requirements.

6. The method of optimizing a cell allocation of claim 5, wherein said optimizing requirements are conditions for reducing the absolute value of the difference between the number of the existing cuts in said first and second blocks.

7. The method of optimizing a cell allocation of claim 6, wherein said optimizing requirements are set so that the ratio of the number of said cells contained in said first block to the area of said first block may be near the ratio of the number of said cells in said second block to the area of said second block.

8. The method of optimizing a cell allocation of claim 5, wherein said optimizing requirements are obtained by minimizing the value of the cost function including the number of the existing cuts in said first block and that in said second block.

9. The method of optimizing a cell allocation of claim 8, wherein said cost function includes the absolute value of the difference between the number of the existing cuts in said first block and that in said second block.

10. The method of optimizing a cell allocation of claim 8, wherein said cost function includes the squared difference between the number of the existing cuts in said first block and that in said second block.

11. The method of optimizing a cell allocation of claim 8, wherein said cost function includes terms for taking into consideration the balance between the total area of cells allocated to said first block and that of cells allocated to said second block.

12. An apparatus for optimizing a cell allocation using the Min-cut method, comprising:

a setting means for setting a cut line for dividing an area to which cells connected by plural nets are allocated;

an existing cut position deciding means for calculating the number of the existing cuts contained in the first and second blocks generated by dividing said area by said cut line;

an optimizing requirements judging means for judging whether or not the number of the existing cuts in said first block and that in said second block satisfy an optimizing requirements; and a cell allocation modifying means for modifying said cell allocation so that the number of the existing cuts in said first block and that in said second block satisfy said optimizing requirements.

13. The apparatus for optimizing a cell allocation of claim 12, wherein said optimizing requirements are conditions for reducing the absolute value of the difference between the number of the existing cuts in said first block and that in said second block.

14. The apparatus for optimizing a cell allocation of claim 13, wherein said optimizing requirements are set so that the ratio of the number of said cells contained in said first block to the area of said first block may be approximate to the ratio of the number of said cells in said second block to the area of said second block.

15. The apparatus for optimizing a cell allocation of claim 12, wherein said optimizing requirements are obtained by minimizing the value of a cost function including the number of the existing cuts in said first block and that in said second block.

16. The apparatus for optimizing a cell allocation of claim 15, wherein said cost function includes the absolute value of the difference between the number of the existing cuts in said first block and that in said second block.

17. The apparatus for optimizing a cell allocation of claim 15, wherein said cost function includes the squared difference between the number of the existing cuts in said first block and that in said second block.

18. The apparatus for optimizing a cell allocation of claim 15, wherein said cost function includes terms for taking into consideration the balance between the total area of cells allocated to said first block and that of cells allocated to said second block.

19. A method of optimizing a cell allocation, comprising:

allocating cells among divided areas;

determining whether both the total of cell areas allocated to said divided areas, and balance of the existing cuts, which are nets crossing a cut line for dividing said designated areas, satisfy their respective restriction requirements; and re-allocating the cells if either restriction requirement is not satisfied.

* * * * *